United States Patent
Tsuchiya

(10) Patent No.: US 6,831,014 B2
(45) Date of Patent: Dec. 14, 2004

(54) METHOD OF MANUFACTURING A SEMICONDUCTOR APPARATUS USING CHEMICAL MECHANICAL POLISHING

(75) Inventor: Yasuaki Tsuchiya, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/231,173

(22) Filed: Aug. 30, 2002

(65) Prior Publication Data

US 2003/0049929 A1 Mar. 13, 2003

(30) Foreign Application Priority Data

Sep. 4, 2001 (JP) ........................................ 2001-268112

(51) Int. Cl.$^7$ ............................................ H01L 21/302
(52) U.S. Cl. ...................... 438/691; 438/692; 438/694; 438/745; 438/751
(58) Field of Search ............................... 438/691, 692, 438/694, 745, 751

(56) References Cited

U.S. PATENT DOCUMENTS 6,326,299 B1 * 12/2001 Homma et al. ............. 438/633
6,368,955 B1 * 4/2002 Easter et al. ................ 438/633
6,524,376 B2 * 2/2003 Aoki et al. ............... 106/14.42

FOREIGN PATENT DOCUMENTS

| JP | 05-315331 | | 11/1993 | ....... H01L/21/3205 |
|----|-----------|---|---------|---------------------|
| JP | 08-64594  | * | 3/1996  | ....... H01L/21/3205 |
| JP | 08-064594 |   | 3/1996  | ....... H01L/21/3205 |
| JP | 08-083780 |   | 3/1996  | ......... H01L/21/304 |
| JP | 2000-012543 |  | 1/2000 | ....... H01L/21/3205 |
| JP | 2000-315666 |  | 11/2000 | ......... H01L/21/304 |
| JP | 2001-089747 |  | 4/2001 | ......... H01L/21/304 |

* cited by examiner

Primary Examiner—Hsien Ming Lee
(74) Attorney, Agent, or Firm—McGinn & Gibb, PLLC

(57) ABSTRACT

A method of manufacturing a semiconductor apparatus includes the step (a) to the step (f). In the step (a), an insulation film is formed on a semiconductor substrate. In the step (b), a wiring trench is formed which extends to the insulation film. In the step (c), a first conductive film is formed which covers an inner surface of the wiring trench and covers the insulation film. In the step (d), a second conductive film is formed which fills the wiring trench and covers the first conductive film. In the step (e), the second conductive film is removed by chemical mechanical polishing (CMP) until a surface of the first conductive film is exposed. In the step (f), a surface of the second conductive film is polished by using a first solution such that a first protective film for protecting the second conductive film is formed. In the step (g), the first conductive film and the second conductive film is removed by CMP until a surface of the insulation film is exposed.

25 Claims, 3 Drawing Sheets

- 105: WIRING TRENCH
- 104: WIRING FILM
- 103: BARRIER FILM
- 102: INSULATION FILM
- 101: SUBSTRATE
- 111: SEMICONDUCTOR APPARATUS

106: PIT

106': PIT

107: PIT

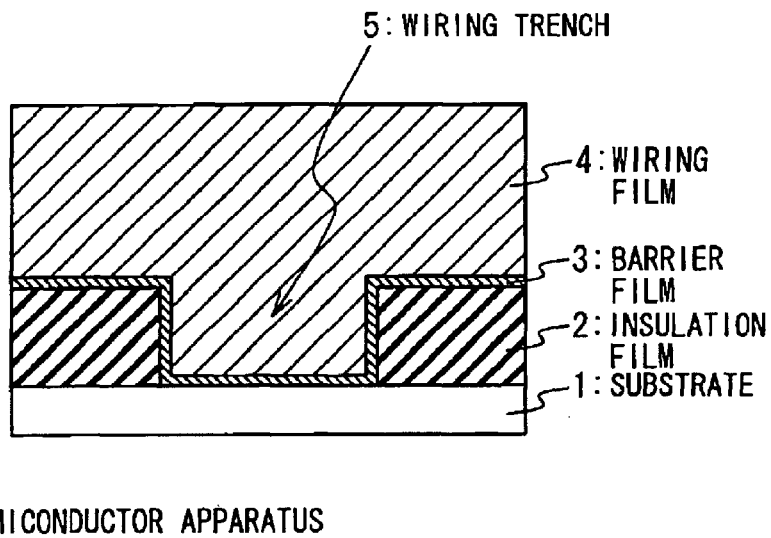
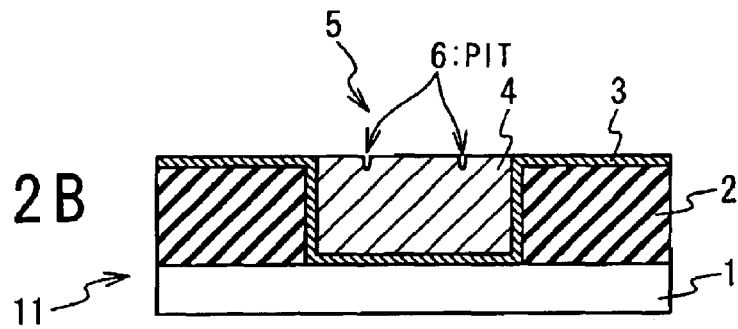
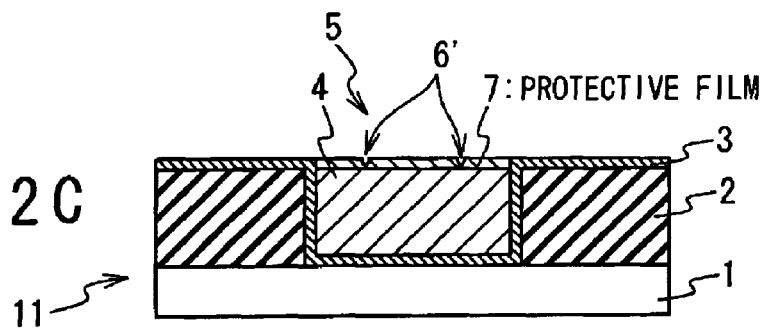
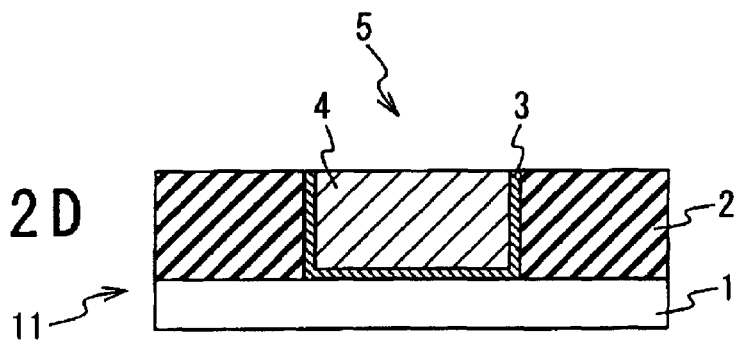

METHOD OF MANUFACTURING A SEMICONDUCTOR APPARATUS USING CHEMICAL MECHANICAL POLISHING

BACKGROUND OF THE INVENTION

1. Field of the Invention

The present invention relates to a method of manufacturing a semiconductor apparatus. More particularly, the present invention relates to a method of forming a copper wiring pattern in a semiconductor apparatus.

2. Description of the Related Art

The enlargement of a chip size and the miniaturization of a minimum machining dimension lead to the sharp Increase in parasitic capacitance and interconnect resistance caused by the wiring, which results in a wiring delay. As a method of solving it, an inter-level insulation film with a low dielectric constant is used for decreasing the parasitic capacitance. Also, a copper wiring with a small resistance is used for decreasing the interconnect resistance. Thus, the drop in the capacitance C through the low dielectric constant and the drop in a resistance R through the copper enable the reduction In the wiring delay (~RC)

In order to drop the interconnect resistance, it is also important to drop an average wiring length. Since the average wiring length is inversely proportional to the number of wiring layers, a multi-level Interconnection technique is important for making the wiring into a multiple-layer configuration. To do so, a damascene wiring structure technique and a chemically mechanically polishing (CMP) technique become essential which can attain the multiple-layer configuration without involving the concave and convex portions on the surface of a lower layer.

The CMP is the step for precisely polishing a surface by using an abrasive material, in a process for manufacturing a semiconductor apparatus. It precisely flattens an upper portion of a lower layer so as not to form the concave and convex portions on an upper layer. The manufacturing step is the very fine step. Thus, the high technologies are required for an abrasive material, a polishing condition, a polishing apparatus, a washing method and the like.

The problems in the CMP of the conventional technique will be described below with reference to FIGS. 1A to 1D.

FIGS. 1A to 1D is a section view showing a step of a CMP process in forming a damascene wiring. It shows a substrate 101, an Insulation film 102, a barrier film 103, a wiring film 104 and a wiring trench 105.

The substrate 101 is the substrate on which a semiconductor element, an inter-level insulation film, a damascene wiring and the like are formed. It may be a semiconductor substrate made of silicon, or a semiconductor substrate on which an insulation film made of silicon dioxide and silicon nitride is formed.

The insulation film 102 is the insulation film using an organic material such as a polymer of a hydrocarbon system or using an inorganic material such as silicon dioxide.

The barrier film 103 is a metallic thin film. It protects the inter-level insulation film 102 from being exposed to plasma, in the process, and also protects the wiring film 104, from being diffused into an insulation film 102. It is made of titanium nitride, tantalum and the like.

The wiring film 104 is the wiring film made of a metal having a low electric resistivity. It is formed in a wiring trench in the insulation film, and it functions as the damascene wiring. For example, it is made of copper.

Next, the manufacturing step will be described below with reference to FIGS. 1A to 1D.

In FIG. 1A, the insulation film 102 is formed on the substrate 101. Then, a wiring trench 105 is formed by using a photolithography process. After that, the barrier film 103 is deposited so as to cover an inner surface of the wiring trench 105 and the insulation film 102. And then the wiring film 104 is formed on the barrier film 103.

In FIG. 1B, the wiring film 104 is polished by carrying out a first polishing operation of CMP in which the barrier film 103 is used as a stopper. Consequently, the upper side of the wiring film 104 from the barrier film 103 is removed, and a surface of the barrier film 103 is exposed.

In FIG. 1C, a surface of the barrier film 103 and a surface of the wiring film 104 in the wiring trench 105 are rinsed through pure water. This rinsing operation washes the polishing solution of the CMP remaining on the surface.

In FIG. 1D, the barrier film 103 is polished by a second polishing operation of the CMP in which the insulation film 102 is used as a stopper. Consequently, the barrier film 103 and the wiring film 104 on the upper side from the insulation film 102 are removed, and a surface of said insulation film 102 is exposed.

However, in the step of FIG. 1B, the polishing operation of the CMP may cause slight pits 106 to be generated on the surface of the wiring film 104. The pit 106 may be a case of etched pits caused by a chemically etching action or a case of a mechanical local damage caused by abrasive particles. These pits 106 are not removed even after a pure water rinsing step (FIG. 1C), and it remains in its original state (pits 106'). Then, in the second polishing step (FIG. 1D) of the CMP, it becomes larger pits 107 resulting from the chemically etching action or the mechanical damage.

In particular, the polishing solution used in the CMP sensitively reacts to a change in its concentration, pH and the like so that its property may be changed. It takes about one minute including the pure water rinsing step of FIG. 1C, until the start of the step of FIG. 1D after the completion of the step of FIG. 1B. Meanwhile, if the polishing solution is not perfectly removed by the pure water rinsing step and even the slight solution remains on the wiring surface, the chemical property may be largely changed, including the effect of the pure water. In this case, a wiring metal or a protective film formed in the CMP on the wiring metal may be etched at a high etching speed that never appears in the usual usage. That is, there may be a case that even the pure water rinsing operation and the protective film can not prevent the generation of the pit 106 caused by the etching.

For example, since the wiring film 104 in the wiring trench 105 is formed on a narrow portion, a grain size is not very large. Thus, a rate of a grain boundary volume is high, which easily brings about a boundary etching, and results in a tendency that the pit 106 is easily generated. Hence, a technique is desired for suppressing the generation of the pit 106 caused by the etching and the like, on the surface of the wiring film 104 in the wiring trench 105. The step of the pure water rinsing operation of the wiring film 104 in the CMP can not be carried out for a long time because of a relation to other processes, a throughput and a cost and the like. Hence, a technique is desired for suppress the etching on the wiring surface in a short time in the middle step of the CMP.

Even if the slight pit 106 is generated in FIG. 1B and the polishing solution is not perfectly removed in FIG. 1C, a technique is desired for suppressing the increase of the pit 106 in the second polishing step of the CMP (FIG. 1D) and polishing and removing the pit 106 In the second polishing step. Also, the technique is desired for forming the damascene wiring in which a sectional area of wiring is constant, there is no dependency on a location, and a wiring resistance is small and stable.

In relation to the above-mentioned problems, Japanese Laid Open Patent Application (JP-A 2001-89747) discloses a polishing composition and a polishing method. The contents is as follows:

In this invention, a composition containing a benzotriazole derivative is used as the polishing composition when the CMP is carried out. The copper CMP is carried out by using the composition containing the benzotriazole derivative. Consequently, since a protective film is formed on a copper surface, the corrosion after the polishing operation is avoided. In addition, this provides the action for suppressing a copper film polishing speed.

Japanese Laid Open Patent Application (JP-A 2000-315666) discloses a method of manufacturing a semiconductor integrated circuit apparatus. The contents is as follows:

In this invention, a polishing solution containing anticorrosive is used as the polishing solution when the CMP is done. The anticorrosive is the chemicals for forming a corrosive resistant protective film on a metallic surface and thereby suppressing the progress of the polishing through the CMP. Here, the benzotriazole is used. Then, while a copper CMP is carried out, the protective film is formed on the copper surface. Consequently, the corrosion after the polishing operation is protected. In addition, the copper film polishing speed is suppressed.

Japanese Laid Open Patent Application (JP-A 2000-12543) discloses a method of manufacturing a semiconductor integrated circuit apparatus. The contents is as follows:

In this invention, the slurry containing the benzotriazole is used as a polish slurry when the CMP is done. The usage of the slurry containing the benzotriazole enables the polishing operation while the surface of a copper film is protected. Thus, it is possible to polish the copper film in which the corrosion of the copper film and the dishing are suppressed without any large reduction in a throughput.

Japanese Laid Open Patent Application (JP-A-Heisei 8-83780) discloses an abrasive material and a polishing method. The contents is as follows:

In this invention, an abrasive material containing the benzotriazole is used as the abrasive material when the CMP is done. The usage of the abrasive material containing the benzotriazole protects the surface of a copper film, and suppresses an isotropic chemical and mechanical polishing action. Thus, only a convex surface of the polished film is removed by the mechanical polishing operation. Hence, it is possible to carry out the polishing operation in which the dishing is little.

Japanese Laid Open Patent Application (JP-A-Heisei, 8-64594) discloses a method of forming a wiring. The contents is as follows:

In this invention, the abrasive particle solution containing the benzotriazole is used as the abrasive particle solution when the CMP is done. The usage of the abrasive material containing the benzotriazole enables the prevention of a surface of a copper film and the protection of the generation of the corrosion. Thus, it is possible to protect the surface corrosion during the formation of a metallic wiring (during the polishing operation) and after the formation, and thereby possible to prevent the deterioration in a quality.

Japanese Laid Open Patent Application (JP-A-Heisei 5-315331) discloses a method of manufacturing a semiconductor apparatus and an apparatus for washing the same. The contents is as follows:

In this invention, a copper wiring is washed by using a water solution containing the benzotriazole after the formation of the copper wiring. The usage of the water solution containing the benzotriazole enables a protective film (Cu-BTA) to be formed on the surface of the copper film, and thereby possible to prevent the corrosion of the copper wiring.

SUMMARY OF THE INVENTION

Therefore, an object of the present invention is to provide a method of manufacturing a semiconductor apparatus, which reduce a damage to a damascene wiring surface in a CMP process, when a damascene wiring is formed.

Another object of the present invention is to provide a method of manufacturing a semiconductor apparatus, which suppress and prevent a grain boundary etching of the damascene wiring material in the CMP process when the damascene wiring is formed.

Still another object of the present invention is to provide a method of manufacturing a semiconductor apparatus, which suppress an unnecessary polishing action on a wiring material in a CMP process when a damascene wiring is formed.

Yet still another object of the present invention is to provide a method of manufacturing a semiconductor apparatus, which reduce a usage amount of pure water in a water rinsing operation and a rinsing time in a CMP process, when a damascene wiring is formed.

It is also an object of the present invention is to provide a method of manufacturing a semiconductor apparatus, which improve of a reliability in a wiring formation.

In order to achieve an aspect of the present invention, the present invention provides a method of manufacturing a semiconductor apparatus including the steps of: (a) forming an insulation film on a semiconductor substrate; (b) forming a wiring trench extending to the insulation film; (c) forming a first conductive film to cover an inner surface of the wiring trench and cover the insulation film; (d) forming a second conductive film to fill the wiring trench and cover the first conductive film; (e) removing the second conductive film by chemical mechanical polishing (CMP) until a surface of the first conductive film is exposed; (f) polishing a surface of the second conductive film by using a first solution such that a first protective film for protecting the second conductive film is formed: and (g) removing the first conductive film and the second conductive film by CMP until a surface of the insulation film is exposed.

The method of manufacturing a semiconductor apparatus further includes the step of: (h) polishing the surface of the second conductive film by using a second solution such that a second protective film for protecting the second conductive film is formed.

In the method of manufacturing a semiconductor apparatus, the first solution is a water solution containing benzotriazole or benzotriazole derivative.

In the method of manufacturing a semiconductor apparatus, the second solution is a water solution containing benzotriazole or benzotriazole derivative.

In the method of manufacturing a semiconductor apparatus, a concentration of the benzotriazole or the benzotriazole derivative in the water solution is 0.1 to 0.01 wt %.

In the method of manufacturing a semiconductor apparatus, the second conductive film includes copper.

In order to achieve another aspect of the present invention, the present invention provides a method of manufacturing a semiconductor apparatus including the steps of: (i) providing a semiconductor substrate with a first platen unit containing a platen for carrying out CMP, wherein the semiconductor substrate includes an insulation film, a wiring trench extending to the insulation film, a first conductive film formed to cover an inner surface of the wiring trench and cover the insulation film, and a second conductive film formed to fill the wiring trench and cover the first conductive film: (j) removing the second conductive film by CMP until a surface of the first conductive film is exposed; (k) polishing a surface of the second conductive film by using a first solution such that a first protective film for protecting a surface of the second conductive film is formed; (l) moving the semiconductor substrate from the first platen unit to a second platen unit; and (m) removing the first conductive film and the second conductive film by CMP until a surface of the insulation film is exposed.

In the method of manufacturing a semiconductor apparatus, the first platen unit and the second platen unit are installed within the same apparatus.

The method of manufacturing a semiconductor apparatus further includes the step of: (n) polishing the surface of the second conductive film by using a second solution such that a second protective film for protecting the second conductive film is formed.

In the method of manufacturing a semiconductor apparatus, the first solution is a water solution containing benzotriazole or benzotriazole derivative.

In the method of manufacturing a semiconductor apparatus, the second solution is a water solution containing benzotriazole or benzotriazole derivative.

In the method of manufacturing a semiconductor apparatus, a concentration of the benzotriazole or the benzotriazole derivative In the water solution is 0.1 to 0.01 wt %.

In the method of manufacturing a semiconductor apparatus, the second conductive film is composed of copper.

In order to achieve still another aspect of the present invention, the present invention provides a method of manufacturing a semiconductor apparatus including the steps of: (o) forming an insulation film on a semiconductor substrate; (p) forming a wiring trench extending to the insulation film; (q) forming a first conductive film to cover an inner surface of the wiring trench and cover the insulation film; (r) forming a second conductive film to fill the wiring trench and cover the first conductive film; (s) removing the second conductive film by chemical mechanical polishing (CMP) under first condition until a surface of the first conductive film is exposed; (t) forming a first protective film on a surface of the second conductive film for protecting the second conductive film by using a first solution; and (u) removing the first conductive film and the second conductive film by CMP under second condition until a surface of the insulation film is exposed.

In the method of manufacturing a semiconductor apparatus, the first condition is different from the second condition.

The method of manufacturing a semiconductor apparatus further includes the step of: (v) forming a second protective film on the surface of the second conductive film for protecting the second conductive film by using a second solution.

In the method of manufacturing a semiconductor apparatus, the first solution is a water solution containing benzotriazole or benzotriazole derivative.

In the method of manufacturing a semiconductor apparatus, the second solution is a water solution containing benzotriazole or benzotriazole derivative.

In the method of manufacturing a semiconductor apparatus, a concentration of the benzotriazole or the benzotriazole derivative in the water solution is 0.1 to 0.01 wt %.

In the method of manufacturing a semiconductor apparatus, the second conductive film includes copper.

BRIEF DESCRIPTION OF THE DRAWINGS

FIGS. 2A to 2D are section views showing steps of manufacturing a semiconductor apparatus, in an embodiment of a semiconductor apparatus, according to the present invention;

DESCRIPTION OF THE PREFERRED EMBODIMENTS

Figure 1A:
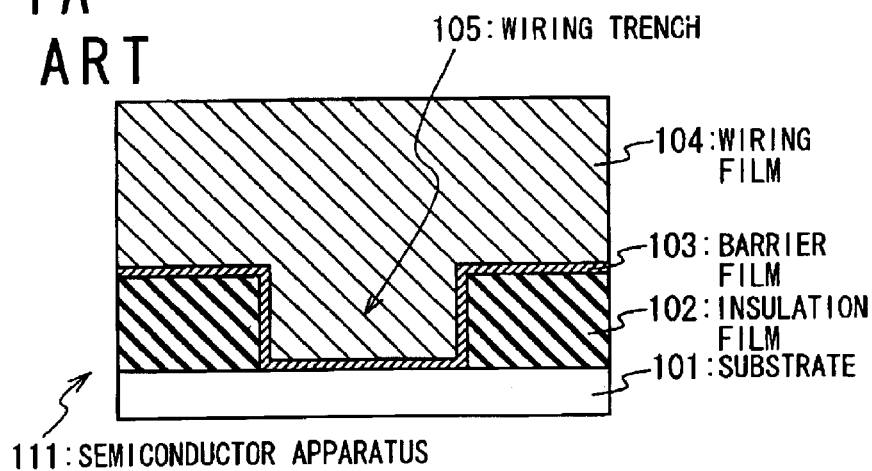
FIGS. 1A to 1D are section views showing steps of manufacturing a semiconductor apparatus, in a prior art.
Figure 1B:
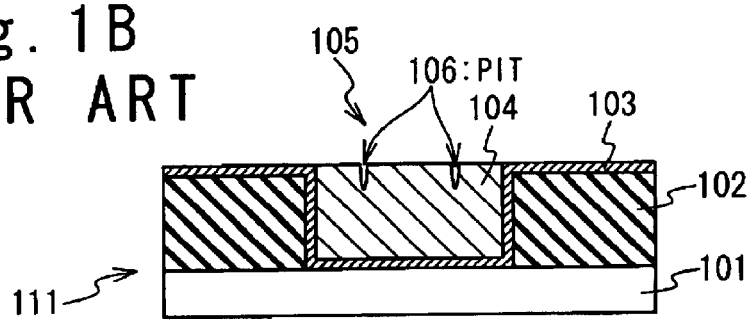
Figure 1C:
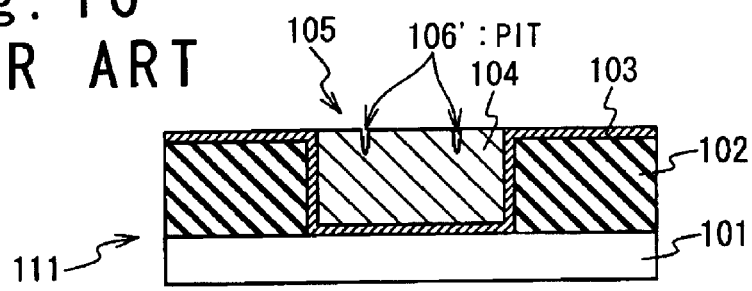
Figure 1D:
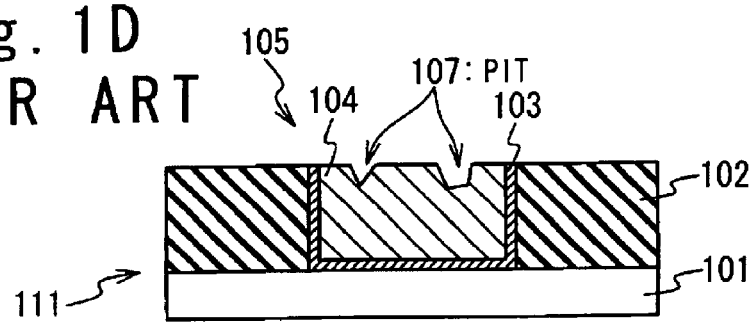

An embodiment of a method of manufacturing a semiconductor apparatus according to the present invention will be described below with reference to the attached drawings.

This embodiment is described by exemplifying a semiconductor apparatus having a metallic wiring of one layer. However, the present invention is applied to metallic wirings of respective layers, even in a semiconductor apparatus having a structure of a multi-level (multiple-layer) wiring.

FIGS. 2A to 2D are section views showing an embodiment of a method of manufacturing a semiconductor apparatus, according to the present invention. FIGS. 2A to 2D sequentially show the steps of manufacturing a semiconductor apparatus 11.

The semiconductor apparatus 11 in FIGS. 2A to 2D is illustrated by picking up the sections of the semiconductor apparatus 11. It includes a substrate 1, an insulation film 2, a barrier film 3, a wiring film 4, a wiring trench 5, pits 6, 6' and a protective film 7.

In the present invention, the reliability of the wiring formation is improved by inserting a benzotriazole process between a plurality of chemical mechanical polishing (CMP) processes, which are essential for a wiring forming process, in addition to a pure water rinsing step, in a multi-level (multiple-layer) wiring structure having a damascene wiring. Due to the process using the benzotriazole, it is possible to reduce the etching action on a surface of the wiring, and thereby possible to form the wiring without any damage.

The contents of FIGS. 2A to 2D will be described below.

The substrate 1 serving as the semiconductor substrate is the substrate on which semiconductor elements, wirings and the like are formed. It may be a semiconductor substrate made of silicon, or a semiconductor substrate on which insulation film made of inorganic system such as silicon dioxide and silicon nitride is formed. Or, it may be a semiconductor substrate having a multi-level (multiple-layer) structure of an insulation film in which a plurality of wiring structures, elements and the like are embedded. In this embodiment, it is a silicon substrate on which an insulation film made of silicon dioxide is formed.

The insulation film 2 is the insulation film formed on the substrate 1 by using a sputtering method, a CVD method, a spin coating method and the like. An inorganic or organic material having a low dielectric constant is used. The portions between the wirings, between the wiring and the element and between the elements are insulated. For example, silicon dioxide and silicon nitride are used as the inorganic material. Also, silicon dioxide may be used, which are doped by using an organic material, an organic group, a hydrogen, a hydroxyl group and the like as impurities. It has a function as a polish stopper when the barrier film 3 (which will be described later) is polished, through the CMP. Its film thickness is about 500 nm. In this embodiment, it is designed as a two-layer structure Its lower layer is an insulation film in which an organic material is used such as a polymer in a hydrocarbon system, and its upper layer is an inorganic insulation film such as silicon dioxide.

The barrier film 3 as a first conductive film is the metallic thin film formed on the insulation film 2 and on a wall surface (inner surface) of the wiring trench 5 by using a sputtering method, a evaporating method, a plating method, a CVD method and the like. It protects the insulation film 2 from being exposed to plasma and the like, in the process for forming the damascene wiring. Also, it protects the wiring film 4 (which will be described later) from being diffused into the insulation film 2. It is made of a refractory metal (a high melting point metal) or its nitride. For example, it is made of tantalum, tantalum nitride, titanium nitride and a multiple-layer film composed of them. In this embodiment, it is made of the tantalum nitride, and its film thickness is about 30 nm.

The wiring film 4 as a second conductive film is the metallic film formed so as to fill the wiring trench 5 (which will be described later) and cover the barrier film 3, by using the sputtering method, the evaporating method, the plating method and the like. Finally, the portion formed in the wiring trench 5 becomes the damascene wiring. It is made of a metal whose electric resistivity is low, for the wiring, For example, it is copper, aluminum or tungsten. The copper is used in this embodiment. Typically, its film thickness, immediately after the film formation before the formation of the wiring trench 5, is 1300 nm=500 nm corresponding to the depth of the wiring trench 5 (the thickness of the insulation film 2)+800 nm above the wiring.

The wiring trench 5 is the trench in which the metallic wiring for damascene wiring is formed. It is formed so as to extend into the insulation film 2, by using a photo lithography technique. In this embodiment, its depth is 500 nm, and its width is 200 nm.

The pit 6 is the concave portion formed on the surface of the wiring film 4 by a first polishing operation (an operation for polishing the wiring film 4 until the barrier film 3 is exposed) of the CMP polishing operation. The reasons for forming the pit 6 are considered as follows. One reason is that the surface of the wiring film 4 is etched by a chemical component of a polishing solution. Another reason is that grain particles are stripped because their grain boundaries are etched by the chemical component of tile polishing solution. A damage caused by an abrasive particle may also be the reason for forming the pit 6.

The protective film 7 is the film thinly formed on the surface portion of the wiring film 4 on which the pit 6 is formed. It has the resistance against the etching action of the CMP polishing solution. It also has a certain resistance against the CMP polishing operation. It has a function of protecting the pit 6 from being made larger by the etching action of the polishing solution or the CMP polishing process, in a next CMP polishing process.

To the conventional pure water rinsing step in FIG. 2C, a step of forming the protective film 7 is added, in addition to the pure water rinsing step. That is, after the pure water rinsing step of supplying the pure water on the wiring film 4, a protective chemical solution by which a protective film is formed on the wiring film 4 is supplied to thereby form the protective film 7.

In the conventional process, if CMP polishing solution slightly remains on the surface, there will be a possibility that the pure water changes the chemical property of the solution at the pure water rinsing operation. In that case, the wiring film 14 (copper) may be etched by the solution. However, in the process of the present invention, due to the effect of the protective film 7, it is possible to exclude the possibility that the wiring film 14 (copper) is etched. At the same time, it is possible to protect the existing pit 6 and also possible to protect the etching from progressing in the next CMP polishing process. In particular, the effect of protecting the grain boundary etching is large on the surface portion of the wiring film 4 in the wiring trench 5 having the small diameter of the grain particle and having a large number of grain boundaries.

The benzotriazole or the benzotriazole derivative is used as the protective chemical solution. The concentration of the benzotriazole (BTA) or the benzotriazole derivative (BTAD) in the water solution is preferably 0.01 to 0.1 wt %. In this embodiment, a benzotriazole 0.04 wt % water solution is used. At this time, the protective film 7 is considered to be a passive state film formed by the coupling of the copper and the benzotriazole.

The chemical mechanical polishing (CMP) operation will be described below with reference to FIG. 3.

Figure 3:
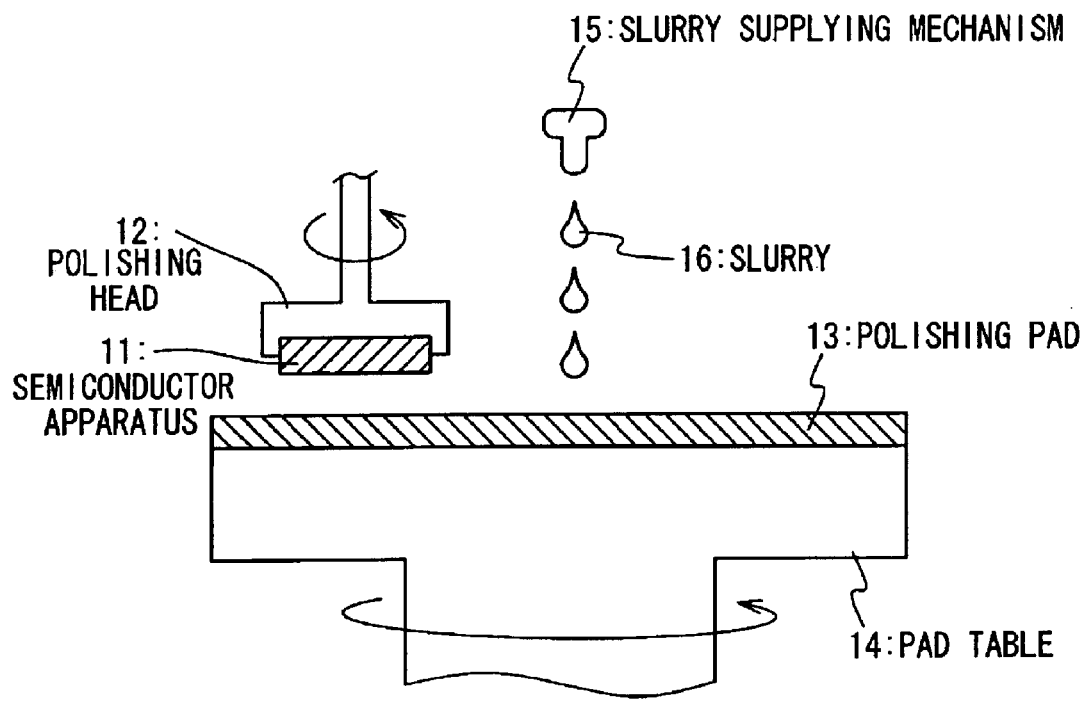
FIG. 3 is a conceptual view of a CMP process in relation to a semiconductor apparatus, according to the present invention.

FIG. 3 is a section view showing the configuration of an apparatus for carrying out the CMP. One set of an apparatus having the configuration of FIG. 3 is prepared for one kind of a CMP polishing operation. It includes a semiconductor apparatus 11, a polishing head 12, a polishing pad 13, a pad table 14, a slurry sending mechanism 15 and a slurry 16.

The semiconductor apparatus 11 is the semiconductor apparatus 11 (the substrate 1+the insulation film 2+the barrier film 3+the wiring film 4), as shown in FIGS. 2A or 2C. The polished plane on which the CMP is performed is oriented towards the side of the polishing pad 13, and the opposite side thereto is held by the polishing head 12.

The polishing head 12 pushes the semiconductor apparatus 11 against the polishing pad 13 at a regular pressure while holding the semiconductor apparatus 11. Also, in order to obtain the regularity of the machining operation, there may be a case that the polishing head 12 carries out not only a rotating motion but also a swinging motion.

The polishing pad 13 is mounted on the upper portion of the pad table 14, and it polishes the semiconductor apparatus 11 while keeping the slurry 16 which will be described later. Typically, it is the pad made of expanded polyurethane.

A temperature of the pad table 14 is controlled by a water cooled system in order to avoid the deformation caused by the temperature, as much as possible. Then, a material is used in which its rigidity is strong and its coefficient of linear expansion is low. For example, it is an alumina ceramic.

The slurry 16 sending mechanism 15 has the mechanism so that the abrasive particles of the slurry 16 are not dried or condensed within solvent, and a desirable sending speed is maintained. Also, it has the mechanism that a concentration of the solvent is maintained.

The typical machining condition using the CMP process of the CMP apparatus shown in FIG. 3 is as follows:

| | |
|---|---|
| Pressure to Push Semiconductor Apparatus 11 | 4 psi |
| Rotation Number of Polishing Head 12 | 80 rpm |
| Rotation Number of Polishing Pad 13 (Pad Table 14) | 80 rpm |
| Slurry Flow Amount from Slurry Sending Mechanism 15 | 200 cc/min |

In the present invention, the CMP apparatus is not limited to the CMP apparatus described in FIG. 3. Similarly, it is possible to use another apparatus used in the conventional technique. Also, in the present invention, the condition is not limited to the above mentioned machining conditions.

The slurry 16 is the chemical solution having the abrasive particles to polish and remove the wiring film 4 and the barrier film 3 chemically and/or mechanically. The slurry having the abrasive particles such as alumina or manganese oxide is used for the CMP of the conductive film, such as the case of the first polishing operation (the operation for polishing the wiring film 4) of the CMP and/or the case of the second polishing operation (the operation for polishing the barrier film 3). However, it is not necessary to use the same slurry and same machining condition for the CMPs of wiring film 4 and the barrier film 3. Also, if wiring film 4 and the barrier film 3 can be polished and removed by the CMP, the slurry will not be limited to them. Other slurries (for example, other abrasive particles or a slurry that does not contain the abrasive particle) is also available.

Figure 4:
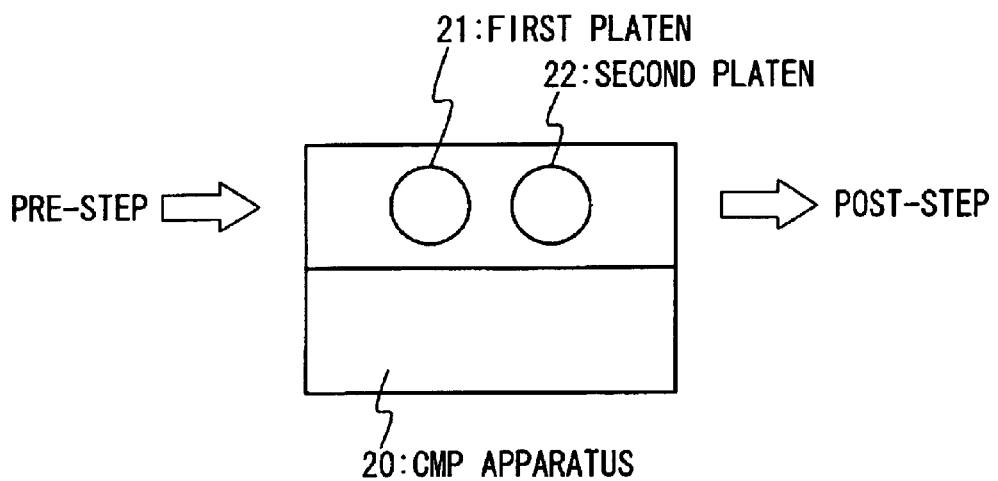
FIG. 4 is a schematic view showing a CMP process in relation to a semiconductor apparatus, according to the present invention.

A CMP apparatus 20 will be described below with reference to FIG. 4. FIG. 4 is a schematic view showing the CMP apparatus 20. The CMP apparatus 20 has a first platen unit 21 and a second platen unit 22.

The first platen unit 21 and the second platen unit 22 are configured for the apparatus for carrying out the CMP shown in FIG. 3. It includes the function described in FIG. 3 and carries out the CMP operation One kind of CMP is carried out for each platen unit.

In the process for manufacturing the semiconductor apparatus, the first platen unit 21 receives the semiconductor apparatus 11 (substrate 1) through a feeding mechanism (not shown) from a pre-step (not shown) Then, it carries out the first polishing process of the CMP. That is, it polishes the wiring film 4 until the barrier film 3 is exposed. In succession, the surface treatment (polishing, forming the protective film 7) using the benzotriazole water solution (benzotriazole+pure water) is carried out on the first platen unit 21, in addition to the usual pure water rinsing operation. Next, the second platen unit 22 receives the semiconductor apparatus 11 through the feeding mechanism (not shown). Then, it carries out the second polishing process. After the completion of the two CMP processes, the semiconductor apparatus 11 is fed to a post-step (not shown) through the feeding mechanism (not shown).

In the present invention, the first platen unit 21 mainly polishes the wiring film 4 through the first polishing operation, and forms the protective film 7 on the surface. Then, the second platen unit 22 carries out the second polishing operation.

The operation with regard to the embodiment of the method of manufacturing a semiconductor apparatus, according to the present invention, will be described below with reference to the attached drawings.

With reference to FIGS. 2A to 2D, the insulation film 2 is firstly formed on the substrate 1 by using the spin coating method.

Next, the wiring trench 5, which penetrates the insulation film 2 and extends to the substrate 1, is formed on the insulation film 2, by the photo lithography process.

After that, by using the sputtering method, the barrier film 3 is formed on the insulation film 2 and substrate 1 to cover the inner surface of the wiring trench 5 and cover said insulation film 2.

In succession, the wiring trench 5 is filled with the wiring film 4 (copper) by the plating method, and the wiring film 4 is formed to cover the barrier film 3.

Consequently, the structure of FIG. 2A is completed.

Next, for the semiconductor apparatus 11 having the structure of FIG. 2A, the semiconductor apparatus 11 is set in the first platen unit 21 of the CMP apparatus 20 by a substrate feeding mechanism (not shown).

Then, a first polishing slurry is supplied on the first platen unit 21. The first polishing operation in the CMP under the first condition is performed on the wiring film 4 (copper) by using the wiring film 4 as a stopper. Thus, the film on the upper side from the barrier film 3 is removed in the wiring film 4 (copper), the barrier film 3 on the insulation film 2 is exposed.

The first polishing operation is done at a polishing speed of a relatively high speed. Thus, the chemical performance (the etching and the like) of the polishing solution and the mechanical performance (the abrasive particle and the like) are strong. Hence, there may be a case that the pit 6 caused by the etching is generated on the surface of the wiring film 4 (copper) Depending on a case, there may be a case that the particle is lost. This situation is shown in FIG. 28.

Next, for the structure of FIG. 2B, the pure water is supplied on the surface of the first platen unit 21. Then, the polished film material, the first polishing solution remaining on the wiring film 4 (copper) and the barrier film 3 are removed and washed.

Next, the benzotriazole water solution serving as the protective chemical solution is supplied on the first platen unit 21. And then, the surface treatment (polishing, forming the protective film 7) is done by using a first solution (the protective chemical solution (benzotriazole water solution)) so that the protective film 7 is formed on the surface of the wiring film 4 (copper) containing the pit 6.

After that, the pure water rinsing operation is again done. This situation is shown in FIG. 2C.

The typical processing condition of the pure water rinsing (washing) operation shifting from FIG. 2B to FIG. 2C and the condition of the process (the process of the protective chemical solution) using the first platen unit 21 (CMP apparatus) when the protective film 7 is formed are as follows.

(1) Pure Water Rinsing

| | |
|---|---|
| Pressure to Push Semiconductor Apparatus 11 | 1.5 psi |
| Rotation Number of Polishing Head 12 | 80 rpm |
| Polishing Pad 13 (Pad Table 14) | 80 rpm |
| Pure Water Flow Amount | 200 cc/min |
| Processing Time | 10 Seconds |

(2) Formation of Protective Film 7

| Pressure to Push Semiconductor Apparatus 11 | 1.5 psi |
|---|---|
| Rotation Number of Polishing Head 12 | 80 rpm |
| Polishing Pad 13 (Pad Table 14) | 80 rpm |
| Benzotriazole Water Solution (0.04 wt %) Flow Amount | 200 cc/min |
| Processing Time | 10 Seconds |

In FIG. 2C, the protective film 7 is formed by the process using the protective chemical solution (benzotriazole water solution). The protective film 7 has the effect of protecting and stabilizing the grain boundary of the copper in the wiring film 4 and the boundary of the copper/barrier film 3. That is, this provides the effect of reducing the defect and improving the electro-migration resistance.

Next, for the structure of FIG. 2C, the semiconductor apparatus 11 is set In the second platen unit 22 of the CMP apparatus 20 by the substrate feeding mechanism (not shown). Then, a second polishing slurry is supplied on the second platen unit 22. The second polishing operation in the CMP under the second condition is performed on the barrier film 3 and the wiring film 4 by using the insulation film 2 as a stopper. Thus, the barrier film 3 on the insulation film 2 except the inside of the wiring trench 5, and the barrier film 3 and the wiring film 4 having a thickness equal to or greater than that of the insulation film 2 within the wiring trench 5 are removed. The surface of the insulation film 2 is exposed. This situation is shown in FIG. 2D.

The second condition and the first condition are almost the same as the above-mentioned typical machining condition using the CMP process of the CMP apparatus. However, the polishing speed of the second condition is slower than that of the first condition. The second polishing process forms the surface of damascene wiring. Therefore, the polishing speed of the second condition should be slow such that precise surface is obtained.

In FIG. 2D, the pit 6 formed by the first polishing operation is protected from the etching by the protective film 7. For this reason, even if the polishing solution remains after the first polishing operation, it does not become larger than the original state until the shift to the second polishing operation (it is not etched to the size larger than the original state). Then, if a depth of the pit 6 is equal to or less than a thickness of the barrier film 3, the pit 6 will be removed by polishing the surface layer of the wiring film 4 through the second polishing operation.

After the completion of the second polishing operation, the pure water rinsing operation is carried out At this time, after the pure water rinsing operation, the surface treatment (polishing, forming the protective film) is carried out by using a second solution (the above-mentioned protective chemical solution (the benzotriazole water solution and the like)). Since the protective film is formed by the process, it is possible to protect the surface of the wiring film 4 from being damaged in the post-process(not shown).

Also, the protective film 7 maintains the situation on the surface of the wiring film 4, and prevents the wiring film 4 in the wiring trench 5 from being easily polished. Thus, the dishing is prevented on the surface of the wiring film 4 in the second polishing operation. That is, it is possible to attain the flat surface finish of the wiring. Hence, the flatness on the surface is extremely improved to thereby make the multi-plexing easier. Then, it is possible to form the wiring of a high accuracy in which the distribution of wiring heights (wiring resistances) is little.

In some cases, the protective film 7 is scraped to a degree. Even if it is perfectly scraped, by using the second polishing slurry contained BTA forms the protective film 7. Thus, the protective film 7 remains during the second polishing operation and even after the second polishing operation. If the protective film 7 remains after the second polishing operation, the wiring film 4 will be continuously protected after that.

As shown in FIGS. 2A to 2D, it is done in the successive CMP process such as the first polishing operation, the pure water rinsing operation, the benzotriazole water solution process (protective chemical solution), the second polishing operation and the pure water rinsing operation. Also, another benzotriazole water solution process (protective chemical solution), if needed. The special apparatus is not needed for the benzotriazole water solution process. The benzotriazole water solution is only supplied after the pure water rinsing operation. That is, the special improvement is not needed for the CMP apparatus The manufacturing step is smoothly carried out. If the CMP apparatus that carries out the successive process and has the two platens is used, only one apparatus will carry out the consistent CMP process. Thus, there is not a substantial increase in a tact time, and there is not a substantial drop in a throughput. Hence, it is obtained the technique effective in making the elements into the multiple-layer configuration in association with the miniaturization of the minimum machining dimension.

In this embodiment, the process of the protective chemical solution is done after the pure water rinsing operation. However, they may be done at the same time.

According to the present invention, the grain boundary etching is avoided on the surface of the damascene wiring in the CMP process, when the damascene wiring is formed. In addition, the damages in the side slit, the pit and the like is avoided to thereby improve the reliability. That is, it is possible to stabilize a sectional area of the wiring, and thereby possible to reduce the resistance of the wiring to a small value to satisfy the design condition.

The formation of the protective film enables the unnecessary polishing (dishing) to the wiring material in the CMP process to be suppressed when the damascene wiring is formed, and thereby enables the reliability of the wiring to be improved. Then, in the process after that, the possibility that the surface of the wiring film is damaged is reduced to thereby improve the reliability of the wiring.

Also, the yield of the wiring is improved, which leads to the improvement of the yield when the semiconductor apparatus itself is manufactured. That is, the improvement of the reliability enables the cost to be dropped.

Moreover, when the damascene wiring is formed, the pure water rinsing operation after the first polishing operation is partially replaced by the process using the protective chemical solution. In this case, it is possible to reduce the usage amount of the pure water and the rinsing time.

According to the present invention, the grain boundary etching on the surface of the damascene wiring is avoided when the damascene wiring is formed. Then, the damages in the side slit, the pit and the like is avoided to thereby improve the reliability of the wiring.

What is claimed is:

1. A method of manufacturing a semiconductor apparatus, comprising:

forming an insulation film on a semiconductor substrate;

forming a wiring trench in said insulation film;

forming a first conductive film to cover an inner surface of said wiring trench and cover said insulation film;

forming a second conductive film to fill the wiring trench and cover the first conductive film;

substantially removing said second conductive film by chemical mechanical polishing (CMP) until a surface of said first conductive film is exposed;

after said substantially removing said second conductive film, polishing surface of said second conductive film by using a first solution such that a first protective film for protecting said second conductive film is formed on a surface of said second conductive film;

removing said first conductive film and said second conductive film by until a surface of said insulation film is exposed; and after said removing said first conductive film and said second conductive film, polishing said surface of said second conductive film by using a second solution such that a second protective film for protecting said second conductive film is formed.

2. The method of manufacturing a semiconductor apparatus according to claim 1, wherein said first solution is a water solution containing at least one of benzotriazole and a benzotriazole derivative.

3. The method of manufacturing a semiconductor apparatus according to claim 2, wherein a concentration of at least one of said benzotriazole and said benzotriazole derivative in said water solution is 0.1 to 0.01 wt %.

4. The method of manufacturing a semiconductor apparatus according to claim 3, wherein said second conductive film comprises copper.

5. The method of manufacturing a semiconductor apparatus according to claim 1, wherein said second solution comprises a water solution containing at least one of benzotriazole and a benzotriazole derivative.

6. The method according to claim 1, wherein said removing said second conductive film comprises chemical mechanical polishing using water.

7. The method according to claim 1, wherein said removing said first conductive film and said second conductive film is performed after said polishing said surface of said second conductive film.

8. The method according to claim 1, wherein said first protective film is thinly formed to protect and stabilize the grain boundary of said second conductive film and a boundary between said second conductive film and said first conductive film.

9. The method according to claim 1, wherein said second conductive film comprises a flat surface finish.

10. The method according to claim 1, wherein said second conductive film is formed under pressure of approximately 1.5 psi, and
wherein a flow amount of said first solution is approximately 200 cc/mm.

11. The method according to claim 1, wherein said wiring trench corn rises a depth of approximately 500 nm and a width of approximately 200 nm.

12. The method according to claim 1, wherein said first solution comprise a concentration of benzotriazole in a water solution of approximately 0.04 wt %.

13. The method according to claim 1, further comprising:
polishing said surface of said second conductive film by using said second solution for removing a pit in said second conductive film where said pit is equal to or less than a thickness of said first conductive film.

14. A method of manufacturing a semiconductor apparatus, comprising:
providing a semiconductor substrate with a first platen unit containing a platen for carrying out CMP, wherein said semiconductor substrate comprises an insulation film, a wiring trench in said insulation film, a first conductive film formed to cover an inner surface of said wiring trench and cover said insulation film, and a second conductive film formed to fill said wiring trench and cover said first conductive film;

substantially removing said second conductive film by CMP until a surface of said first conductive film is exposed;

after said substantially removing said second conductive film, polishing a surface of said second conductive film by using a first solution such that a first protective film for protecting a surface of said second conductive film is formed on a surface of said second conductive film;

moving the semiconductor substrate from the first platen unit to a second platen unit;

removing said first conductive film and said second conductive film by CMP until a surface of said insulation film is exposed; and after said removing said first conductive film and said second conductive film, polishing said surface of said second conductive film by using a second solution such that a second protective film for protecting said second conductive film is formed.

15. The method of manufacturing a semiconductor apparatus according to claim 14, wherein said first platen unit and said second platen unit are installed within the same apparatus.

16. The method of manufacturing a semiconductor apparatus according to claim 15, wherein said first solution comprises a water solution containing at leas one of benzotriazole and a benzotriazole derivative.

17. The method of manufacturing a semiconductor apparatus according to claim 16, wherein a concentration of at least one of said benzotriazole and said benzotriazole derivative in said water solution is 0.1 to 0.01 wt %.

18. The method of manufacturing a semiconductor apparatus according to claim 17, wherein said second conductive film comprises copper.

19. The method of manufacturing a semiconductor apparatus according to claim 14, wherein said second solution comprises a water solution containing at least one of benzotriazole and a benzotriazole derivative.

20. A method of manufacturing a semiconductor apparatus comprising:
forming an insulation film on a semiconductor substrate;
forming a wiring trench extending to said insulation film;
forming a first conductive film to cover an inner surface of said wiring trench and cover said insulation film;
forming a second conductive film to fill the wiring trench and cover the first conductive film;
substantially removing said second conductive film by chemical mechanical polishing (CMP) under first condition until a surface of said first conductive film is exposed;
after said substantially removing said second conductive film, forming a first protective film on a surface of said second conductive film for protecting said second conductive film by using a first solution;
removing said first conductive film and said second conductive film by CMP under second condition until a surface of said insulation film is exposed; and
after said removing said first conductive film and said second conductive film, polishing said surface of said second conductive film by using a second solution such that a second protective film for protecting said second conductive film is formed.

21. The method of manufacturing a semiconductor apparatus according to claim 20, wherein said first condition is different from said second condition.

22. The method of manufacturing a semiconductor apparatus according to claim 20, wherein said first solution comprises a water solution containing at least one of benzotriazole and a benzotriazole derivative.

23. The method of manufacturing a semiconductor apparatus according to claim 22, wherein a concentration of at least one of said benzotriazole and said benzotriazole derivative in said water solution is 0.1 to 0.01 wt %.

24. The method of manufacturing a semiconductor apparatus according to claim 23, wherein said second conductive film comprises copper.

25. The method of manufacturing a semiconductor apparatus according to claim 20, wherein said second solution comprises a water solution containing at least one of benzotriazole and a benzotriazole derivative.

* * * * *